United States Patent [19]
Oyamada

[11] Patent Number: 4,692,790
[45] Date of Patent: Sep. 8, 1987

[54] STRUCTURE FOR CONNECTING LEADLESS CHIP CARRIER

[75] Inventor: Takashi Oyamada, Tokyo, Japan

[73] Assignee: NEC Corporation, Japan

[21] Appl. No.: 772,342

[22] Filed: Sep. 4, 1985

[30] Foreign Application Priority Data

Sep. 6, 1984 [JP] Japan .......................... 59-135548[U]
Nov. 27, 1984 [JP] Japan .......................... 59-179656[U]

[51] Int. Cl.$^4$ ...................... H01L 23/10; H01L 23/02; H01L 23/32
[52] U.S. Cl. ...................................... 357/79; 357/74; 357/75; 357/80
[58] Field of Search ...................... 357/81, 80, 79, 74, 357/75; 361/386, 387, 388; 174/52 FP

[56] References Cited

U.S. PATENT DOCUMENTS 4,008,487 2/1977 Vogt ...................................... 357/79
4,069,497 1/1978 Heidlitz ............................... 361/386
4,563,725 1/1986 Kirby ............................... 174/52 FP
4,605,986 8/1986 Bentz et al. ........................ 361/386

Primary Examiner—Andrew J. James
Assistant Examiner—S. V. Clark
Attorney, Agent, or Firm—Ostrolenk, Faber, Gerb & Soffen

[57] ABSTRACT

A structure for accurately connecting a connection pattern on a leadless chip carrier (LCC) to a connection pattern on a receiving surface by means of a connector, i.e., without resorting to solder. The structure includes a generally frame- or box-shaped support cover in which the LCC is received. The support cover is provided with resilient portions at at least two sides of the inner contour thereof in order to resiliently hold the LCC therebetween. A frame surrounds the support cover to retain the same. The support cover in which the LCC is fit is coupled in the frame and retained therein by a pressure which is exerted by a cover.

11 Claims, 8 Drawing Figures

STRUCTURE FOR CONNECTING LEADLESS CHIP CARRIER

BACKGROUND OF THE INVENTION

The present invention relates to an improvement in a structure for accurately connecting a connection pattern provided on a leadless chip carrier (LCC) to that provided on a receiving surface using a connector in place of solder.

An LCC is usually provided with a connection pattern which is to be connected to that provided on a receiving surface, which is usually a printed circuit board, with the intermediary of a connector. Such connection may be implemented with a structure in which a frame with a through bore is mounted on the receiving surface to surround the connection pattern on the receiving surface. The LCC is loosely received in the bore of the frame through a conductor connector, while a cover which has a pressing tongue at the center thereof presses the LCC from above to retain it in a predetermined position.

Generally, since the dimensions of the outer contour of LCCs coming out of a production line very substantially, the bore of the frame adapted to position the pattern on an LCC relative to the pattern on a receiving surface needs to be sized large enough to accommodate a product, or LCC, having the largest presumable dimensions. This, however, brings about a problem that when a relatively small LCC is placed in the relatively large bore of the frame, it is apt to move laterally or angularly inside the bore so that predetermined contacts of the pattern on the LCC fail to attain accurate contact with those of the pattern on the receiving surface, resulting in an imcomplete connection.

Furthermore, the dimensional variations of LCCs extends over to the thickness for production reasons. Should such thicknesswise variations be left unabsorbed, the connector would fail to be constantly biased by an adequate force, constituting another cause of incomplete connection. In this respect, as previously stated, the cover is provided with a pressing tongue which presses the LCC from above in order to absorb the thicknesswise variations. However, it is impracticable to absorb the entire thicknesswise variations by means of the pressing tongue only, unless the tongue is provided with greater dimensions or a stronger biasing force. Such not only adds to the overall size and weight of the resulting package but also requires an LCC to be carefully designed in due consideration of its resistivity to externally derived pressures.

Meanwhile, when it is desired to replace the LCC which is fully received in the bore of the frame as previously described, the LCC has to be removed by turning the whole package and receiving surface upside down so that the LCC may drop out of the frame. It follows that where such a substrate is installed in an apparatus, the LCC cannot be removed unless the whole apparatus is turned upside down.

SUMMARY OF THE INVENTION

It is therefore an object of the present invention to provide an improved LCC connecting structure which allows an LCC to be accurately positioned to have a connection pattern thereof adequately connected to a connection pattern of a receiving surface overcoming dimensional variations of the outer contour of the LCC.

It is another object of the present invention to provide an LCC connecting structure which appropriately presses an LCC, which has been positioned on a receiving surface, against a connector.

It is another object of the present invention to provide an LCC connecting structure which facilitates removal of an LCC for replacement.

It is another object of the present invention to provide a generally improved structure for connecting an LCC.

A structure for connecting a first connection pattern provided on a leadless chip carrier (LCC) to a second connection pattern provided on a receiving surface of the present invention comprises a support cover for receiving and retaining the LCC therin and including a plurality of resilient portions for biasing the LCC inwardly from around the LCC, a frame for accommodating the suport cover in the interior of the frame such that the first and second connecting patterns are connected to each other with the support cover, which has received the LCC, retained on the receiving surface, and a cover for pressing the support cover from above to retain the support cover and the LCC within the interior of the frame.

In accordance with the present invention, a structure for accurately connecting a connection pattern on a leadless chip carrier to a connection pattern on a receiving surface by means of a connector, i.e., without resorting to solder is disclosed. The structure includes a generally frame- or box-shaped support cover in which the LCC is received. The support cover is provided with resilient portions at at least two sides of the inner contour thereof in order to resiliently hold the LCC therebetween. A frame surrounds the support cover to retain the same. The support cover in which the LCC is fit is coupled in the frame and retained therein by a pressure which is exerted by a cover The above and other objects, features and advantages of the present invention will become more apparent from the following detailed description taken with the accompanying drawings.

DESCRIPTION OF THE PREFERRED EMBODIMENTS

While the structure for connecting a leadless chip carrier of the present invention is susceptible of numerous physical embodiments, depending upon the environment and requirements of use, substantial numbers of the herein shown and described embodiments have been made, tested and used, and all have performed in an eminently satisfactory manner.

Figure 1:
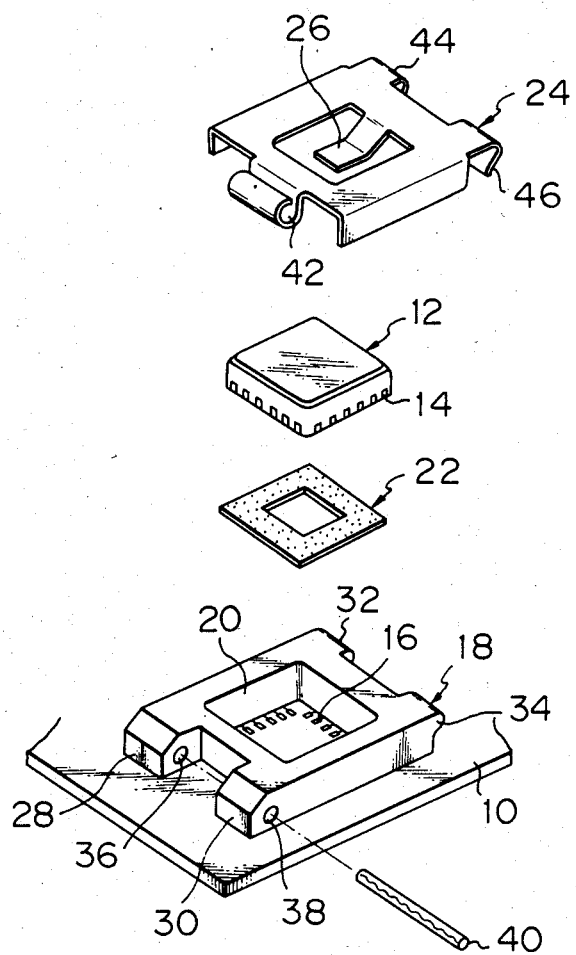
FIG. 1 is an exploded perspective view of one possible structure for connecting an LCC.
Figure 2:
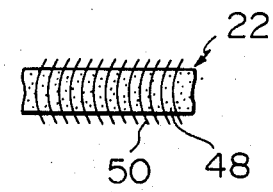
FIG. 2 is an enlarged fragmentary view of a connector included in the structure of FIG. 1.

To better understand the present invention, a brief reference will be made to an LCC connecting structure, shown in FIGS. 1-4, which has certain disadvantages overcome by the present invention. As shown in FIG. 1, the prior art structure a receiving surface 10 is provided with a connection pattern 16 to face a connection pattern 14 provided on an LCC 12. The periphery of the pattern 16 is surrounded by a positioning frame 18. The LCC 12 is put in a through bore 20 of the frame 18 with the intermediary of a condutive connector 22 and, from above the LCC 12, a cover 24 with a pressing tongue 26 is pressed against the LCC 12 to fix it place. The frame 18 includes a pair of legs 28 and 30 and a pair of lugs or projections 32 and 34. The legs 28 and 30 respectively are provided with aligned holes 36 and 38, and a pin 40 is passed through the holes 36 and 38. Meanwhile, the cover 24 is partly turned down to provide a support piece 42 which is rotatably engageable with the pin 40, and engaging portions 44 and 46 which respectively are engageable with the projections 32 and 34 of the frame 18. As shown in FIG. 2, the connector 22 adapted to interconnect the pattern 14 on the LCC 12 and the pattern 16 on the substrate 10 is made up of an insulator 48 made of silicon rubber and a plurality of gold-plated thin wire-like conductors 50 which are embedded in the insulator 48. The connector 22 in use needs to be pressed by a suitable pressure from opposite sides thereof and such a pressure is exerted by the pressing tongue 26 of the cover 24.

Figure 3:
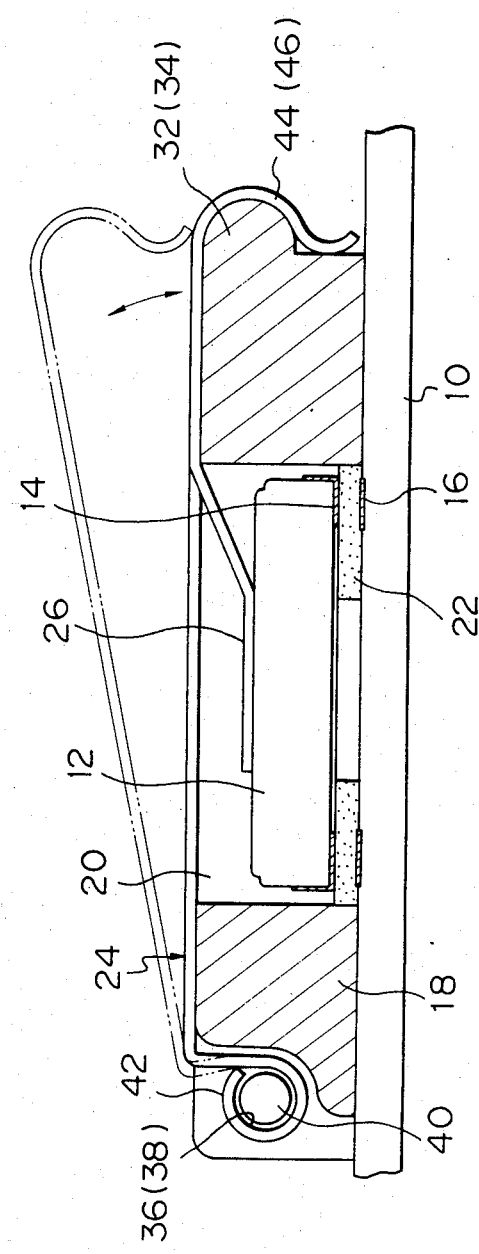
FIG. 3 is a sectional side elevation showing the LCC of FIG. 1 in a packaged position.

As shown in FIG. 3, the LCC 12 is received and accurately positioned in the bore 20 of the frame 18 and, then, pressed by the tongue 26 of the cover 24 from above. At this instant, the cover 24 which is rotatable about the pin 40 due to engagement of the support piece 42 with the pin 40 is displaced from a phantom line position shown in FIG. 3 to a solid line position, so that the engaging portions 44 and 46 respectively are brought into locking engagement with the lugs 32 and 34 of the frame 18. As a result, the LCC 12 is fixedly retained on the substrate 10.

Figure 4:
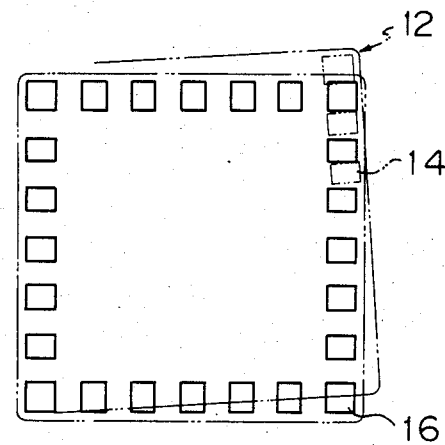
FIG. 4 is a view representative of dislocation of a connection pattern on the LCC of FIG. 1 relative to that on a receiving surface.

As previously stated, the LCC 12 usually involves substantial tolerance, or variations, in external dimensions and, therefore, it is necessary to dimension the frame 18, i.e., bore 20, so that it may match with an LCC 12 having the largest presumable size. However, where a relatively small LCC 12 is placed in the so dimensioned opening 20 of the frame 18, it is apt to move laterally or angularly to prevent the pattern 14 from being adequately interconnected to the pattern 16 on the receiving surface 10. The resulting incomplete connection is illustrated in FIG. 4.

In theory, so long as the difference in size between the LCC 12 and the bore 20 of the frame 18 is small, the connector 22 successfully provides interconnection between the pattern 14 on the LCC 12 and the pattern 16 on the receiving surface 10. In practice, however, the tolerance of the LCC 12 is substantial and, with this in view, the bore 20 of the frame 18 is so dimensioned as to accommodate an LCC 12 whose size is largest of all the presumable sizes. When a relatively small LCC 12 is put in such a frame 18, substantial gaps will develop between the LCC 12 and the walls of the bore 20 causing the LCC 12 to move into contact with unexpected contacts adjacent to desired ones.

In addition, the LCC 12 involves variations in the thicknesswise direction. Although the prior art LCC package attemps to absorb such variations solely by the tongue 26 of the cover 24, it is impractical for the tongue 26 to cover the whole range of variations. Furthermore, as already mentioned, difficulty is experienced in removing the LCC 12 which has been fully received in the bore 20 of the frame 18 as shown in FIG. 3.

Figure 5:
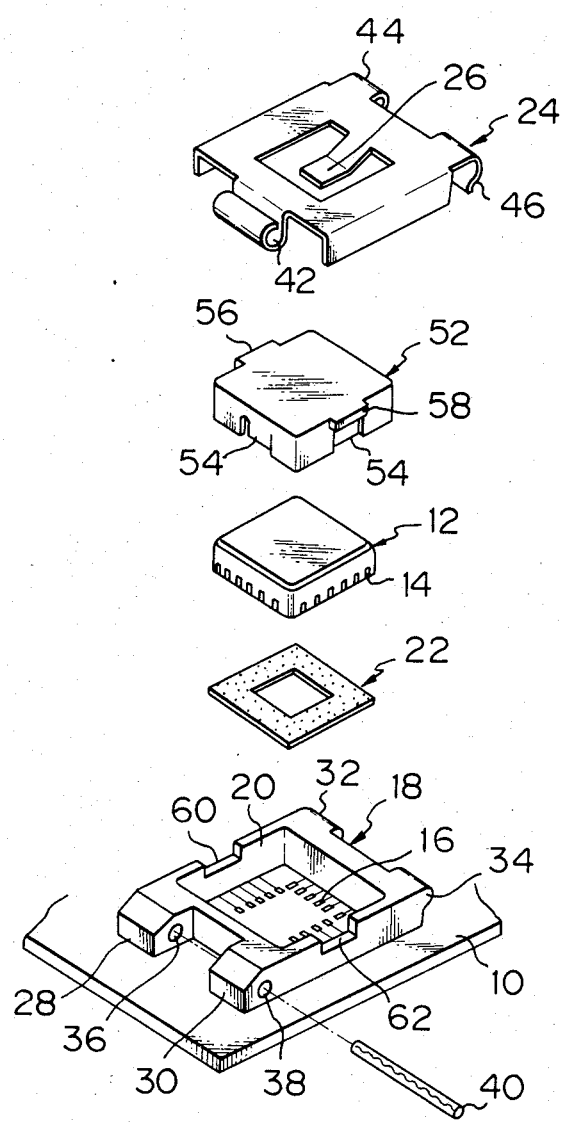
FIG. 5 is an exploded perspective view of an LCC connecting structure embodying the present invention.
Figure 6:
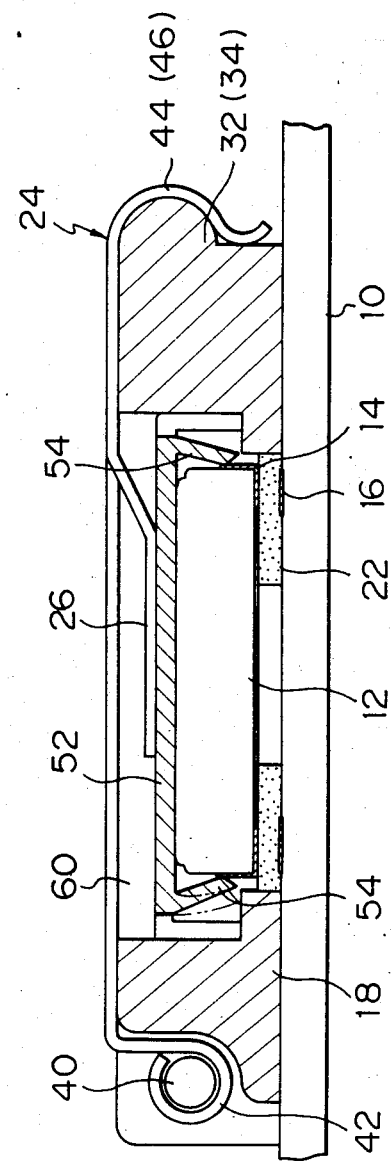
FIG. 6 is a section of the structure of FIG. 5 in which an LCC is packaged.

Referring to FIGS. 5 and 6, an improved LCC connecting structure embodying the present invention is shown. In these drawings, the same or similar structural elements as those shown in FIGS. 1-4 are designated by like reference numerals. As shown in an exploded perspective view in FIG. 5, the structure in accordance with the illustrative embodiment differs from the prior art structure in that it includes a support cover 52 for receiving an LCC 12 therein. Specifically, the structure is such that the support cover 52 which is mounted in a frame 18 is utilized to position the LCC 12, in contrast to the prior art structure in which the LCC 12 is positioned based on the dimensional relationship between the frame 18 and its bore 20 and the LCC 12. The support cover 52 and the frame 18 may each be implemented by a plastic molding to attain dimensional stability which is great enough to eliminate their relative displacement which coupled together.

The support cover 52 is provided with means for preventing it and the LCC 12 from being displaced relative to each other. Specifically, the support cover 52 is provided with a generally box-like configuration which includes at least two (four in this particular embodiment) flexible resilient portions 54. In this construction, when the LCC 12 is fully received in the support cover 52 as shown in FIG. 6 and if the outer contour of the LCC 12 is sized differently from a desired size, it will be evenly pressed inwardly from the four sides by the resilient portions 54 as represented by a phantom line in FIG. 6. As a result, the LCC 12 is held at the center of the support cover 52. Naturally, the resilient portions 54 are configured to exert a suitable degree of resiliency regardless of the dimensions of the LCC 12, i.e., whether they be largest or smallest. The LCC 12 can be removed from the frame 18 simply by picking up the support cover 52 because the support cover will then carry the LCC 12 therewith. The support cover 52 is provided with a pair of differently sized an shaped projections 56 and 58, and the frame 16 is provided with a corresponding pair of notches 60 and 62. The projections 56 and 58 respectively are mated with the notches 60 and 62 to prevent the frame 16 and the support cover 52 from rotating relative to each other, thereby causing the pattern 14 on the LCC 12 to positively face the pattern 16 on the substrate 10. The package is, therefore, free from incomplete connection otherwise brought about by dislocation.

Figure 7:
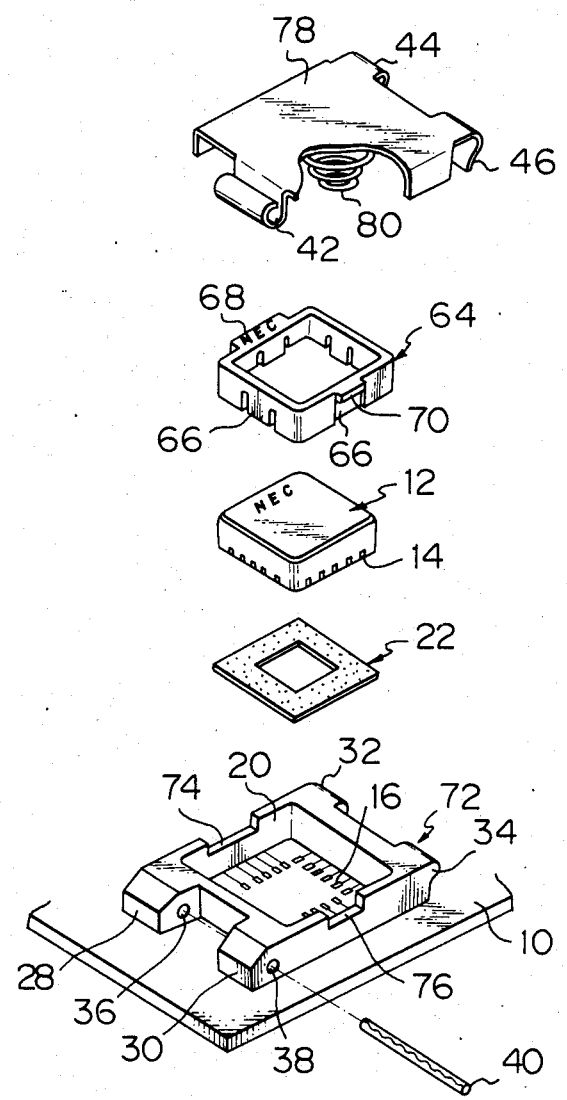
FIG. 7 is an exploded perspective view of another embodiment of the present invention.
Figure 8:
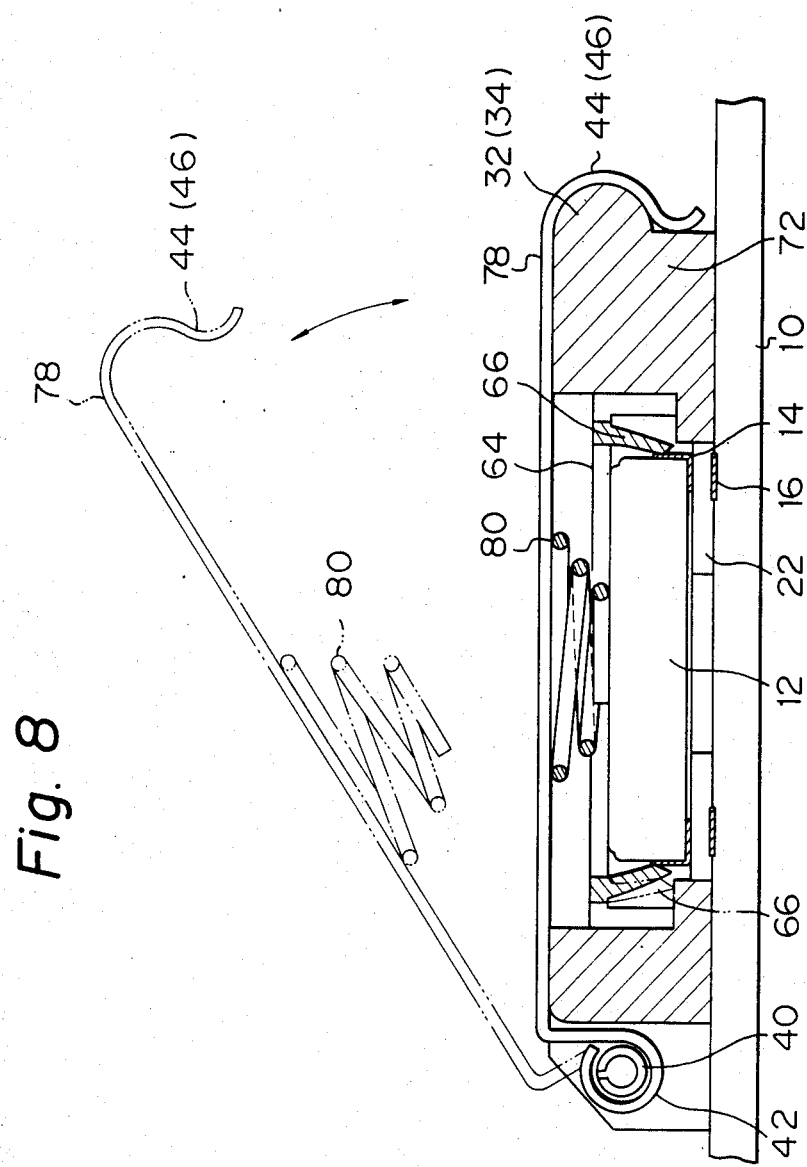
FIG. 8 is a section of the structure of FIG. 7 in which an LCC is packaged.

Referring to FIGS. 7 and 8, another embodiment of the present invention is shown. In this particular embodiment, a support cover 64 is provided with a generally frame-like configuration as distinguished from the box-like configuration of the support cover 52 of the first embodiment. The support cover 64 includes at least two resilient portions (four in the illustrative embodiment) 66, and projections 68 and 70 which correspond to the projections 56 and 58 but are dimensioned or shaped differently from each other. In the illustrative embodiment, the projection 68 is dimensioned larger than the projection 70. A frame 72, on the other hand, is provided with a pair of differently dimensioned notches or recesses 74 and 76, the former being larger than the latter in this particular embodiment. In assembly, the larger projection 68 is received in the larger recess 74 and the smaller projection 70 in the smaller recess 76 to prevent the support cover 64 from rotating relative to the frame 72. This surely holds a predetermined part of the pattern 14 on the LCC 12 in facing relation to that of the pattern 16 on the receiving surface 10, thereby eliminating erroneous connection due to dislocation. Another advantage attainable with the differently shaped projections 68 and 70 is that where the LCC 12 to be nested in the support cover 64 has a square contour, a certain mark or a symbol such as the manufacturer's name ("NEC" in this particular embodiment) may be printed on the support cover 64 adjacent to, for example, the larger projection 68 so as to allow one to correctly couple the LCC 12 in the support cover 64 by aligning the the mark on the support cover 64 with another mark or symbol which may be provided on the LCC 12. Further, the projctions 68 and 70 facilitate removal of the support cover 64 from the frame 72, that is, one can readily pick up the former out of the latter by nipping the projections 68 and 70.

Another difference of the structure of FIG. 7 from that of FIG. 5 is that a generally conical coil spring 80 is disposed inside the cover 78 to replace the pressing tongue 26 of FIG. 5. The coil spring 80 advantageously exerts a predetermined pressure on the connector 22 even if the produced LCC 12 involves dimensional variations in the thicknesswise direction. Also, the coil spring 80 cuts down the necessary space in the opening 20 of the frame 72; that is, the spring 80 provided with a generally conical configuration reduces the thicknesswise space inside the opening 20 of the frame 72 when the cover 78 is engaged with the frame 72. Specifically, as shown in FIG. 8, the coil spring 80 in a compressed position exerts a predetermined pressure without occupying any substantial space and, even if the thickness of the LCC 12 is somewhat deviated from a desired one, it fulfills the assigned function without yielding.

Various modifications will become possible for those skilled in the art after receiving the teachings of the present disclosure without departing from the scope thereof.

What is claimed is:

1. A structure for connecting a first connection pattern provided on a leadless chip carrier to a second connection pattern provided on a receiving surface, said structure comprising:
    a support cover receiving and retaining said leadless chip carrier therein and having a plurality of resilient portions for biasing said leadless chip carrier inwardly of said support cover from positions around said periphery of said leadless chip carrier;
    a frame for accommodating said support cover in an interior portion thereof in such a manner that said first and second connection patterns are connected to each other, said support cover being retained on the substrate; and
    a cover for pressing said support cover toward said substrate to retain said support cover and said leadless chip carrier within said interior of said frame.

2. A structure as claimed in claim 1, further comprising locking means for locking said support cover to the frame.

3. A structure as claimed in claim 2, wherein said locking means comprises at least two projections which extend respectively from opposite edges of the support cover, and notches provided in the frame to receive respectively said projections of the support cover.

4. A structure as claimed in claim 3, wherein one of said projections is provided with a first predetermined mark, and said leadless chip carrier is provided with a second predetermined mark in a portion thereof which is associated with said first predetermined mark.

5. A structure as claimed in claim 4, wherein said first and second predetermined marks comprise alphanumeric characters.

6. A structure as claimed in claim 3, wherein said projections are shaped differently from each other.

7. A structure as claimed in claim 3, wherein said projections are dimensioned differently from each other.

8. A structure as claimed in claim 1, wherein said support cover has a substantially frame-like shape.

9. A structure as claimed in claim 1, wherein said support cover has a substantially box-like shape.

10. A structure as claimed in claim 1, wherein said cover is formed of a thin metal sheet and provided with a generally conical coil spring at a central thereof for pressing said leadless chip carrier.

11. A structure as claimed in claim 1, wherein said support cover and said frame are each made of a plastic.

* * * * *